US009368941B1

(12) United States Patent
Dashti et al.

(10) Patent No.: US 9,368,941 B1
(45) Date of Patent: Jun. 14, 2016

(54) TEMPERATURE COMPENSATION IN AN OPTICAL TRANSMITTER

(71) Applicant: Google Inc., Mountain View, CA (US)

(72) Inventors: Pedram Zare Dashti, Los Gatos, CA (US); Changhong Joy Jiang, Mountain View, CA (US); Jun Zheng, Mountain View, CA (US); Yi Wang, Mountain View, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/826,363

(22) Filed: Aug. 14, 2015

Related U.S. Application Data

(60) Provisional application No. 62/037,397, filed on Aug. 14, 2014.

(51) Int. Cl.
*H01S 3/10* (2006.01)
*H01S 5/40* (2006.01)
*H01S 5/024* (2006.01)
*H01S 5/068* (2006.01)
*H01S 5/0687* (2006.01)
*H01S 5/12* (2006.01)
*H01S 5/06* (2006.01)
*H01S 5/0683* (2006.01)
*H01S 5/026* (2006.01)
*H01S 3/102* (2006.01)
(Continued)

(52) U.S. Cl.
CPC ............. *H01S 5/4087* (2013.01); *H01S 3/0405* (2013.01); *H01S 3/1028* (2013.01); *H01S 3/1317* (2013.01); *H01S 5/0261* (2013.01); *H01S 5/02407* (2013.01); *H01S 5/02453* (2013.01); *H01S 5/0607* (2013.01); *H01S 5/0612* (2013.01); *H01S 5/0687* (2013.01); *H01S 5/06804* (2013.01); *H01S 5/06837* (2013.01); *H01S 5/12* (2013.01)

(58) Field of Classification Search
CPC ............ H01S 5/02453; H01S 5/02407; H01S 5/0607; H01S 5/0612; H01S 5/06804; H01S 5/06837; H01S 5/0261; H01S 3/1028; H01S 3/1317; H01S 3/0405
USPC ....................................................... 372/20, 34
See application file for complete search history.

(56) References Cited

U.S. PATENT DOCUMENTS 6,780,082 B2 * 8/2004 Moore .................. B24B 37/013
257/E21.528
7,739,877 B2 6/2010 Shen et al.
(Continued)

FOREIGN PATENT DOCUMENTS

WO WO-2014072681 A2 5/2014

*Primary Examiner* — Kinam Park
(74) *Attorney, Agent, or Firm* — Honigman Miller Schwartz and Cohn LLP

(57) ABSTRACT

A device includes an array of optical transmitters having first and second temperature sensors each disposed at or near a first and second end of the array of the transmitters. The device includes a controller in communication with the temperature sensors and the transmitters. The controller receives temperature measurements from the temperatures sensors and determines a temperature difference between a first temperature measurement of the first temperature sensor and a second temperature measurement of the second temperature sensor. The controller determines a compensation for each transmitter within the transmitter array based on the temperature difference and a transmitter position within the array of transmitters. The compensation causes the corresponding transmitter to transmit at a wavelength associated with that transmitter. The controller executes the compensations for the transmitters.

30 Claims, 4 Drawing Sheets

(51) Int. Cl.
*H01S 3/131* (2006.01)
*H01S 3/04* (2006.01)

(56) References Cited

U.S. PATENT DOCUMENTS

2003/0053169 A1* 3/2003 Nasu .................... H04B 10/506
                                                    398/91
2005/0275365 A1* 12/2005 Currie ................ H05K 7/20209
                                                    318/471
2012/0076505 A1   3/2012 Azemati et al.
2012/0099611 A1   4/2012 Kim et al.
2012/0189323 A1   7/2012 Xu et al.
2013/0208745 A1*  8/2013 Sjolund ............... H01S 5/02248
                                                    372/34

* cited by examiner

TEMPERATURE COMPENSATION IN AN OPTICAL TRANSMITTER

CROSS REFERENCE TO RELATED APPLICATIONS

This U.S. patent application claims priority under 35 U.S.C. §119(e) to U.S. Provisional Application 62/037,397, filed on Aug. 14, 2014, which is hereby incorporated by reference in its entirety.

TECHNICAL FIELD

This disclosure relates to compensating for temperature changes in a transmitter laser array.

BACKGROUND

A basic communication system generally includes a transmitter that converts a message to an electrical form suitable to be transferred over a communication channel. The communication channel transfers the message from the transmitter to a receiver. The receiver receives the message and converts it back to its original form.

Fiber optic communication is an emerging method of transmitting information from a source (transmitter) to a destination (receiver) using optical fibers as the communication channel. Optical fibers are flexible, transparent fibers made of thin glass silica or plastic that transmits light throughout the length of the fiber between the source and the destination. Fiber optic communication allows for the transmission of data over longer distances and at higher bandwidth than other known forms of communication. Fiber optics are an improved form of communication over metal wires because the light traveled through the fiber experiences less loss and is immune to electromagnetic interference. Companies use optical fibers to transmit telephone signals, internet communication, and cable television signals.

SUMMARY

One aspect of the disclosure provides a device that includes an array of optical transmitters, first and second temperature sensors, and a controller. The array of optical transmitters has a first end and a second end. The first temperature sensor is disposed at or near the first end of the array of transmitters, and the second temperature sensor is disposed at or near the second end of the array of transmitters. The controller is in communication with the temperature sensors and the transmitters. The controller receives temperature measurements from the temperature sensors and determines a temperature difference between a first temperature measurement of the first temperature sensor and a second temperature measurement of the second temperature sensor. Moreover, the controller determines a compensation for each transmitter within the transmitter array based on the temperature difference and a transmitter position within the array based on the temperature difference and a transmitter position within the array of transmitters. The compensation causes the corresponding transmitter to transmit at a wavelength associated with that transmitter. The controller optionally executes the compensations for the transmitters.

Implementations of the disclosure may include one or more of the following optional features. In some implementations, the compensation includes a temperature adjustment. The controller may alter a temperature of each transmitter by its corresponding temperature adjustment. For example, the controller may alter a temperature of one or more transmitters by their corresponding temperature adjustments while assuming a linear temperature gradient between the first and second temperature sensors. In some examples, the controller controls a heater of a transmitter to alter the temperature of the transmitter. The controller receives a transmitter temperature measurement from a temperature sensor of each transmitter (e.g., as feedback to maintain the desired temperature of the transmitter). In some examples, the controller determines a temperature difference between each transmitter and a reference temperature (e.g., the temperature of a heat pump).

In some implementations, the compensation includes a bias current for a heater of a transmitter. The controller may deliver a bias current to the heater of each transmitter that corresponds to the compensation for the transmitter. Alternatively, the compensation may include a bias current for a tuning element of a transmitter. The controller may deliver a bias current to the tuning element of each transmitter that corresponds to the compensation for the transmitter. In some examples, the array of transmitters includes multiple distributed feedback lasers, distributed Bragg reflectors, or other lasers, where each laser outputs a signal at a different wavelength.

The device may further include a heat pump (e.g., a thermo-electric cooler) and a third temperature sensor. The array of transmitters is disposed on the heat pump. The third temperature sensor is disposed on the heat pump and is in communication with the controller. The controller receives a third temperature measurement of the heat pump as feedback from the third temperature sensor to maintain a temperature of the heat pump.

In some implementations, the device further includes a transmitter optical sub-assembly package having first and second ends. The first end of the transmitter optical sub-assembly package is disposed adjacent the first end of the array of transmitters. The second end of the transmitter optical sub-assembly package is disposed adjacent the second end of the array of transmitters. The first and second temperature sensors are disposed on or near the corresponding first and second ends of the transmitter optical sub-assembly package. The device may further include an air mover arranged to flow air over the transmitter optical sub-assembly package. In some examples, the air mover flows air along a direction going from the first end of the transmitter array to the second end of the transmitter array or from the second end of the transmitter array to the first end of the transmitter array. In other examples, the air mover flows the air in an arbitrary direction.

Another aspect of the disclosure provides a method executed by data processing hardware. The method includes receiving temperature measurements from a first temperature sensor disposed at or near a first end of an array of transmitters and a second temperature sensor disposed at or near a second end of the array of transmitters and determining a temperature difference between a first temperature measurement of the first temperature sensor and a second temperature measurement of the second temperature sensor. The method also includes determining a compensation for each transmitter within the transmitter array based on the temperature difference and a transmitter position within the array of transmitters. The compensation causes the corresponding transmitter to transmit at a wavelength associated with that transmitter. The method may optionally include executing the compensations for the transmitters.

In some implementations, the method includes altering a temperature of each transmitter by its corresponding temperature adjustment, when the compensation includes a temperature adjustment. The method may also include controlling a heater of a transmitter to alter the temperature of the transmitter. For example, the method may include altering a temperature of one or more transmitters by their corresponding temperature adjustments while assuming a linear temperature gradient between the first and second temperature sensors. In some examples, the method includes receiving a transmitter temperature measurement from a temperature sensor of each transmitter (e.g., as feedback to maintain a desired temperature of the transmitter.) In some examples, the method also includes determining a temperature difference between each transmitter and a reference temperature.

In some implementations, when the compensation includes a bias current for a heater of a transmitter, the method includes delivering a bias current to the heater of each transmitter that corresponds to the compensation for the transmitter. When the compensation comprises a bias current for a tuning element of a transmitter, the method may include delivering a bias current to the tuning element of each transmitter that corresponds to the compensation for the transmitter. In some examples, the array of transmitters includes multiple distributed feedback lasers, where each laser outputs a signal at a different wavelength.

The method may include receiving a third temperature measurement from a third temperature sensor disposed on a heat pump (e.g., a thermo-electric cooler). The array of transmitters is disposed on the heat pump. The method also includes maintaining a temperature of the heat pump using the third temperature measurement.

In some examples, the method also includes flowing air over the transmitter optical sub-assembly package. In some examples, the method includes flowing air along a direction going from the first end of the transmitter array to the second end of the transmitter array or from the second end of the transmitter array to the first end of the transmitter array.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
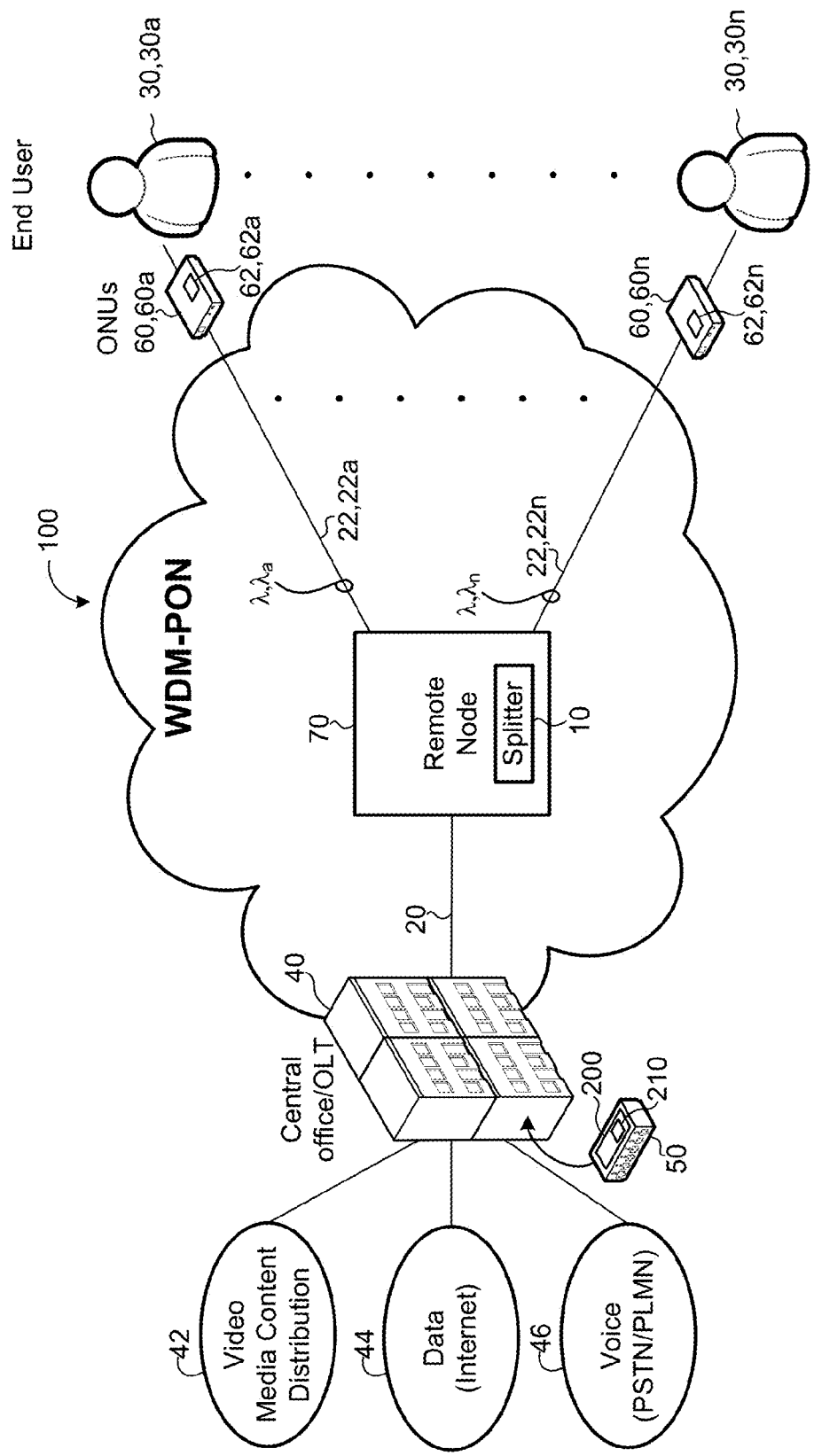
FIG. 1 is a schematic view of a WDM network using an exemplary transmitter device.

Fiber optics communication may include fiber-to-the-home (FTTH) communication, data center communication, metro communication, long haul communication, or any other type of optical network. Although, the following description relates to FTTH, any fiber network may be used. FTTH is the delivery of a communication signal through optical fibers from a central office (CO) or optical line terminal (OLT) to a home or a business of a user. Referring to FIG. 1, a passive optical network (PON) 100 is a point-to-multipoint network architecture that uses optical splitters 10 to enable a single optical fiber feeder 20 to serve multiple users 30a-30n (e.g. 16-128 or more). The PON 100 provides optical signals from a CO 40 and includes an optical line terminal 50 (e.g., optical transmitter/receiver or transceiver) to a number of optical network units/terminals (ONUs) 60. Each ONU 60 includes an optical transmitter/receiver (i.e., transceiver) for transmitting and receiving data from the CO 40. In some examples, the PON 100 includes multiple optical transmitter/receiver or transceiver systems 50, 60. One feeder fiber 20 is sent from the CO 40 to a remote node 70, where the signal is split and distributed to many (e.g., 16-128 or more) different ONUs 60a-60n via fiber feeders 22, 22a-22n.

In some implementations, a wave division multiplexed passive optical network (WDM-PON) 100 provides CO fiber termination consolidation, bandwidth scalability and the easy-to-implement end-to-end Ethernet transparency. WDM-PON 100 offers every broadband subscriber 30 a separate wavelength pair for upstream and downstream transmission respectively; thus offering privacy to each user 30. A WDM-PON network 100 uses a wavelength demultiplexer to distribute optical wavelengths to end-users 30 through an access fiber 22. Optical beams having different wavelengths $\lambda$ propagate without interfering with one another. This allows for several channels of information where each has a different wavelength $\lambda$ to be transmitted simultaneously over a single optical fiber 20. Therefore, the capacity of a WDM-PON network 100 is limited by the number of wavelengths $\lambda$ available in a WDM-PON network 100. In addition, each wavelength $\lambda$ in a WDM-PON network 100 may run at a different speed; therefore, the speed of each individual user 30 may be individually upgraded to a faster speed without updating the speed of other users 30.

There are two types of WDM systems depending on the wavelength patterns: conventional/coarse (CWDM) and dense (DWDM). CWDM provides up to 8 channels in the third transmission window, i.e., C-Band, of silica fibers around 1550 nm. DWDM uses denser channel spacing, but uses the same transmission window as the CWDM. CWDM uses the entire frequency band between the second and third transmission window. Increasing the number of wavelengths $\lambda$ in a system increases the number of users 30 the network 100 can handle. Increasing the total spectrum range to fit more channels increases the number of users 30, but requires a higher accuracy in wavelengths, which increases the number of components used to build the network 100, thus increasing the cost of the network 100. Therefore, CWDM and DWDM are based on the same concept of using multiple wavelengths of light on a single fiber; however, each uses different spacing of the wavelength $\lambda$, number of channels, and the ability to amplify the multiplex signals in the optical space.

The OLT 50 is the endpoint of the PON 100 and terminates the user signals. In addition, the OLT 50 provides the uplink connection to the carrier network. In a WDM PON, the OLT 50 coordinates multiplexing between the ONUs at the user end 30. The OLT 50 sends the fiber optic signal through a feeder fiber 20, and the signal is received by a remote node 70, which demultiplexes the signal and distributes it to multiple users 30.

A multiplexer (MUX) combines several input signals and outputs a combined signal of the individual inputs. The multiplexed signal is transmitted through a physical wire, e.g., single optical fiber 20, which saves the cost of having multiple wires for each signal. As shown in FIG. 1, the CO 40 cross-connects the signals received from several sources, such as video media distribution 42, internet data 44, and voice data 46, and multiplexes the received signals into one multiplexed signal before sending the multiplexed signal to the remote node 70 through the feeder fiber 20. The CO 40 includes a carrier source or a transmitter system 200 (supporting a transmitter device 202) (e.g., a laser diode or a light emitting diode or a transmitter laser array 221) for generating an optical signal that carries the multiplexed signal to the end user 30. On the receiver end, a reverse process occurs using a demultiplexer (DEMUX). The demultiplexer receives the multiplexed signal and divides it into the separate original signals that were originally combined. In some examples, a photodetector converts the optical wave back into its electric form and is located at both the OLT 50 and ONU 60. Rather than having multiple transmitter systems 200 where each has a transmitter 220, the CO 40 may have a transmitter system 200 that includes an array 221 of transmitters 220. This reduces the cost of the transmitter system 200. Therefore, it is desirable to calibrate and adjust each transmitter 220 independently of the other transmitters 220 within the transmitter system 200.

An ONU 60, on the user 30 end, includes a transmitter 62 for generating an optical signal that carries the information to be sent from an end user 30 to the CO 40. Lasers emit light coherently such that the laser output is a narrow beam of light. In some implementations, a laser includes a medium that provides the amplification and the frequency, and mirrors that provide the feedback. Photons bounce off one mirror through the medium and head back to another mirror to bounce back for further amplification. One, and sometimes both mirrors, may partially transmit light to allow a fraction of the generated light to be emitted. A laser diode is an electrically pumped semiconductor laser having an active medium being a p-n junction. The p-n junction is created by doping (i.e., introduction of impurities into a pure semiconductor to change its electrical properties).

Figure 2:
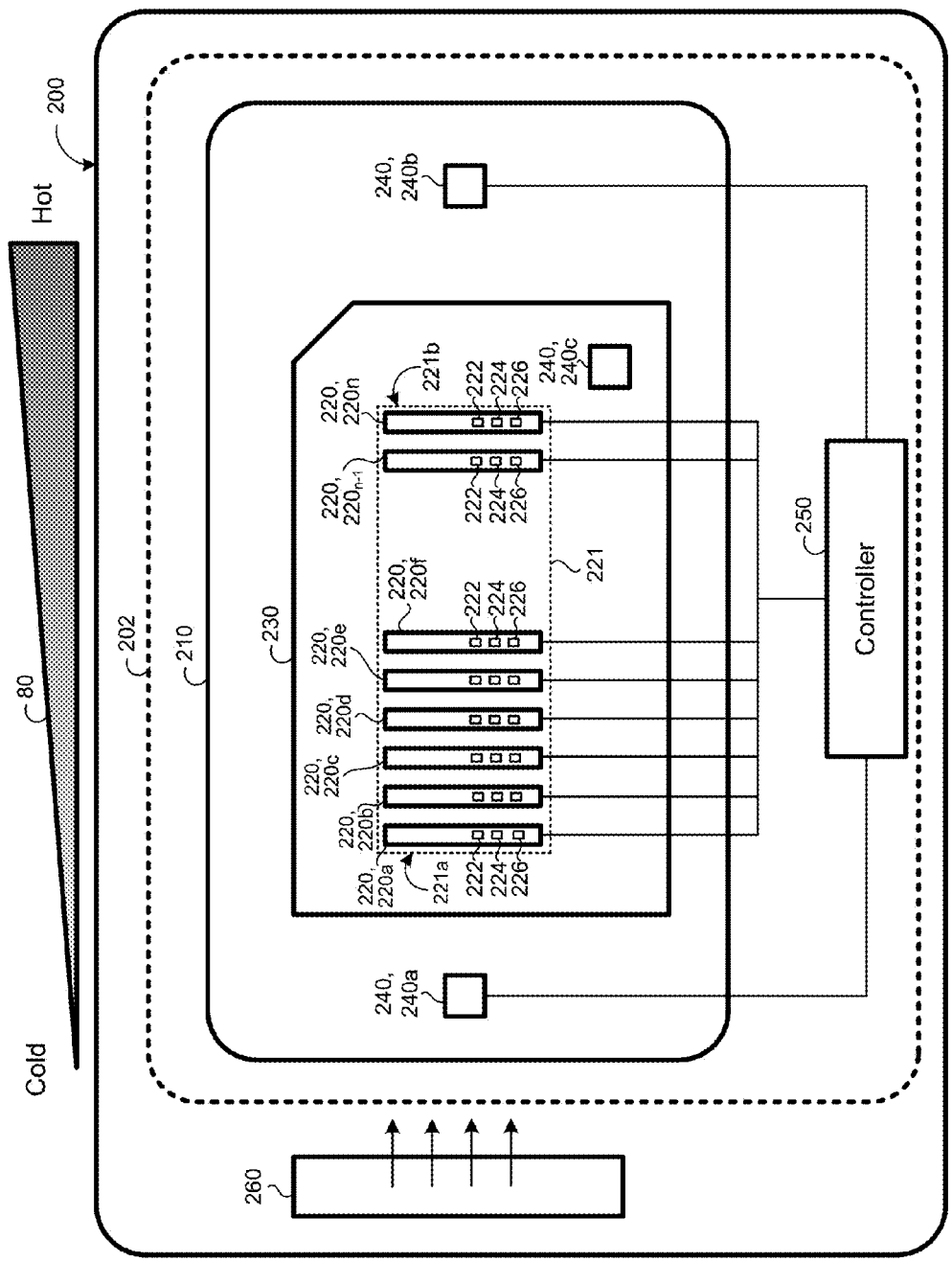
FIG. 2 is a schematic view of the exemplary transmitter device of FIG. 1

Referring to FIG. 2, in some implementations, the transmitter system 200 at the CO 40 includes a transmitter optical sub-assembly (TOSA) 210. The TOSA 210 includes an array 221 of optical transmitters 220 (e.g., one or more optical transmitters 220) each optical transmitter 220 transmitting a signal at a wavelength different than the other optical transmitters 220. Moreover, the TOSA 210 includes a heat pump 230 that supports the optical transmitters 220. The TOSA 210 supports a first temperature sensor 240a disposed at or near a first end 221a of the array 221 of transmitters 220 and a second temperature sensor 240b disposed at or near a second end 221b of the array 221 of transmitters 220. In some examples, the heat pump 230 supports a third temperature sensor 240c that measures a temperature $T_{S3}$ of the heat pump 230. The transmitter system 200 includes a controller 250 (which may optionally be supported by the TOSA 210). The controller 250 is in communication with each of the optical transmitters 220, the heat pump 230, and the temperature sensors 240a, 240b, 240c. In some examples, the TOSA 210 and the controller 250 are supported by the transmitter device 202. Each transmitter 220 is calibrated to emit a specific wavelength λ. In some implementations, each transmitter 220 operates at a specific temperature and any increase or decrease of the temperature may adversely affect the operation of the transmitter 220 and its wavelength accuracy. Each transmitter 220 needs to have accurate control of its temperature to maintain the output wavelength λ of its transmit signal. In some examples, the transmitter system 200 includes an air mover 260 arranged to flow air over the TOSA 210. In other examples, the air mover 260 is positioned adjacent the TOSA 210 or adjacent the transmitter device 202. The air mover 260 removes heat generated by the transmitter system 200 and causes a temperature gradient 80 within the transmitter system 200. The temperature gradient 80 affects the wavelength accuracy of the transmitter system 200. The air mover 260 (e.g., a fan) maintains a permissible operating temperature limit of the transmitter system 200 (reducing the possibility of overheating and ultimately failing). The air mover 260 flows air along a direction going from the first end 221a of the transmitter array 221 to the second end 221b of the transmitter array 221 (as shown in FIG. 2) or vice versa. In other examples, the air mover 260 flows the air in an arbitrary direction. The air mover 260 may cause a temperature gradient 80 within the TOSA 210. As shown, the portion of the TOSA closer to the air mover 260 may be cooler than the portion that is further away from the air mover 260. Therefore, it is desirable to adjust the temperature of each transmitter 220 or use some other compensation method to maintain each transmitter's operating wavelength λ, despite the temperature gradient caused by the air mover 260.

In some implementations, each transmitter 220 includes a temperature sensor 222, a heater 224, and/or a tuning element 226. The transmitter temperature sensor 222 determines a transmitter temperature $T_i$ and communicates the transmitter temperature $T_i$ to the controller 250 (i is the position of the transmitter within the transmitter array 221). The controller 250 may control an output wavelength λ of each transmitter 220 by controlling a temperature of the transmitter 220, a bias current to the heater 224 of the transmitter 220, or a bias current to the tuning element 226 of the transmitter 220.

Figure 3:
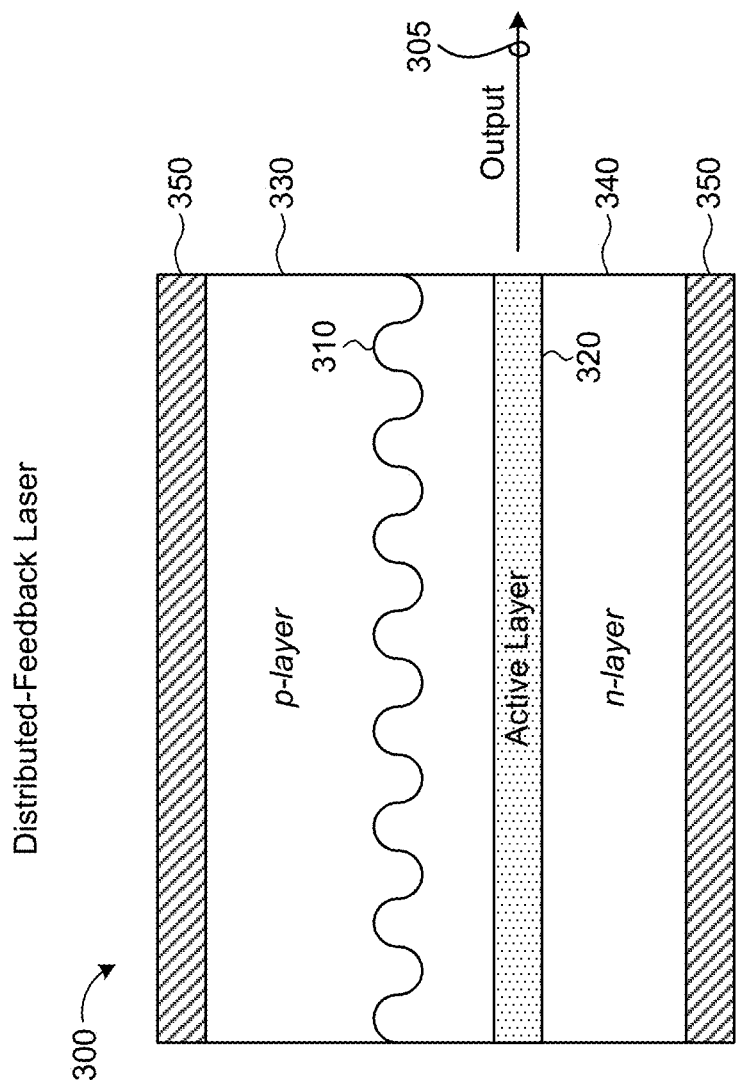
FIG. 3 is a schematic view of a distributed feedback laser used in an exemplary transmitter device.

The one or more laser transmitters 220 may optionally include a Fabry-Perot (FP) laser, a distributed feedback (DFB) laser 300 (FIG. 3), vertical-cavity-surface-emitting laser (VCSEL), or distributed Bragg reflector (DBR) laser. Other lasers may be used as well. FP lasers include an optical gain medium located in a cavity formed by two reflecting facets. In some examples, the one or more laser transmitters 220 is a DFB laser 300 (FIG. 3). A DFB laser 300 is a type of laser diode that can be tuned (by the controller 250) by either changing the temperature or by changing a control current of the DFB laser 300. The DFB laser 300 has a material refractive index, which is dependent on temperature; therefore, the output wavelength λ (e.g., S1, S2) of a DFB laser 300 shifts a few tenths of a nanometer per degree Celsius when the temperature of the material of the DFB laser 300 changes (which changes the refractive index). Similarly, if the control current is increased then the DFB laser 300 is heated and the output wavelength λ of the DFB laser 300 outputting a signal is shifted. A DBR laser (not shown) includes a gain section, a phase-shift section, and a grating section 240 for tuning the optical signal (e.g., Distributed Bragg Reflector (DBR)). In some examples, the transmitter lasers 300 includes a heater 224 and the control current may be applied to the heater 224 of the transmitter laser (e.g., DFB laser 300) or a tuning element (e.g., a grating of a DBR laser).

As shown in FIG. 3, the DFB laser 300 does not have two mirrors that form an optical cavity like other types of lasers. Instead, the DFB laser 300 has a corrugated layer 310 etched internally above an active layer 320 between a p-type layer 330 and an n-type layer 340. The p-type layer 330 and the n-type layer 340 are surrounded by a metalized layer 350. The corrugated layer 310 forms an optical grating that reflects light having a specific wavelength λ. The grating 310 stabilizes the output wavelength λ 305. The output wavelength λ 305 may change with temperature changes that cause the refractive index of the grating 310 to change. The grating 310 acts as the wavelength selection element for at least one of the mirrors and provides feedback, reflecting light back into the cavity to form the resonator. The grating 310 of the DFB laser 300 reflects a narrow band of wavelengths λ that leads to producing only a single longitudinal lasing mode. When the temperature of the DFB laser 300 changes, the grating 310 changes, because it depends on the refractive index, which depends on temperature. Thus, a change in the refractive index alters the wavelength selection of the grating structure 310 and provides a tunable laser. Another way to tune the laser is to alter the current powering the laser, because the current change causes the temperature to change within the laser. The DBR laser is similar to the DFB laser 300 since they both operate in a single longitudinal lasing mode, which produces a narrow band of wavelengths λ. In a DBR laser the grating is outside of the optical gain area. The DBR laser includes only one grating at one end of the laser cavity or two gratings at the two ends of the laser cavity. The grating(s) may be independently biased with a current, which in turn tunes the reflection spectrum of the grating and consequently tunes the output wavelength of the laser 220. VCSEL emit the light perpendicular to the wafer surface rather than at the edge of the chip, i.e., parallel to the wafer surface, as the FP, DFB, or DBR lasers do. The VCSEL includes a gain medium in a very short vertical cavity (about 1 µm) surrounded by Bragg mirrors. The Bragg mirrors include multiple layers of alternating high and low refractive-index material. Other transmitters 220 are possible as well.

The heat pump 230 is a device that provides heat energy from a source to a destination (also known as a heat sink 230). Heat pumps move thermal energy in a direction that is opposite to the direction of spontaneous heat flow by absorbing heat from a cold space and releasing the heat to a warmer space, and vice-versa. The heat pump 230 may use external power to transfer energy (heat energy) from the source to the destination. In this case, the heat pump 230 absorbs heat energy from the transmitters 220, i.e., the heat is transferred from the transmitters 220 to the opposite side of the heat pump 230 altering a temperature of the heat pump 230 (measured by the third temperature sensor 240c). The heat pump 230 may also work in the opposite direction and transfer heat energy from the back side to the transmitters 220 if needed. In some examples, the controller 250 maintains a constant temperature of the temperature $T_{S3}$ measured at the third temperature sensor 240c, which is a temperature of the heat pump 230.

In some examples, the heat pump 230 is a Thermoelectric cooler (TEC). The TEC, also known as a Peltier device, Peltier heat pump, or a solid state refrigerator, uses the Peltier effect to create a heat flux between the junction of two types of materials. The Peltier effect is caused by the presence of heating or cooling at an electrified junction of two different conductors. Thus, when current flows through a junction between two conductors, heat may be generated or removed at the junction. Therefore, the TEC 230 is a solid-state active heat pump that transfers heat from one side of a device (e.g., transmitters 220) to the other (e.g., TEC 230) or vice versa, by consuming electrical energy, depending on the direction of the current.

A temperature difference between each optical transmitters 220 (e.g., DFB Laser 300) in the array 221 and the heat pump 230 (e.g., TEC) can vary from optical transmitters 220 to optical transmitters 220. These differences are determined during production tests. In implementations where the optical transmitters 220 each have a heater 224, a heater bias current is tuned for each optical transmitter 220 until the corresponding wavelength λ is at a desired value. The heater bias current can vary from optical transmitter 220 to optical transmitter 220 in the same array 221. So the $\Delta T_{ci}$ value can randomly vary from optical transmitter 220 to optical transmitter 220 in the same array 221. When an air mover 260 is added (or the air flow direction changes) optical transmitters 220 on one side cool down more than optical transmitters 220 on the other side. It is this change that the controller 250 compensates for by applying more or less heater bias current on the affected optical transmitters 220.

In some implementations, the controller 250 receives a transmitter temperature $T_i$ (where i is the position of the transmitter within the array 221) and a third temperature measurement $T_{S3}$ from the third temperature sensor 240c. The controller 250 determines temperature difference $\Delta T_i$, which is a difference between the transmitter temperature T and the third temperature measurement $T_{S3}$. The values of the temperature difference $\Delta T_i$ are calibrated to a calibrated temperature difference $\Delta T_{ci}$ such that all the transmitters 220 emit at their assigned wavelengths λ. Due to the air flow caused by the air mover 260, the temperature difference, of each transmitter, may change from its calibrated value. The change in temperature difference $\Delta T_a$ of a first transmitter 220a within the transmitter array 221 from its calibrated value may be different than the change in temperature difference $\Delta T_n$ of a last transmitter 220n within the transmitter array 221. For example, and as shown, if the air mover 260 is positioned adjacent the first transmitter 220a, then the change in $\Delta T_a$ of the first transmitter is smaller than the change in $\Delta T_n$ of the last transmitter 220n. Similarly, if the air mover 260 is positioned adjacent the last transmitter 220n, then the change in $\Delta T_n$ of the last transmitter is smaller than the change in $\Delta T_a$ of the first transmitter 220n. Since each transmitter 220 is temperature sensitive and is tuned to output a specific wavelength at a specific temperature, any change in temperature may adversely affect the output wavelength λ of the transmitter 220.

To compensate for the temperature difference $\Delta T_i$ between each transmitter 220 and the third temperature $T_{S3}$ of the third temperature sensor 240c, the controller 250 may determine a compensation $C_i$ for each transmitter 220 within the transmitter array 221. Thus, the controller 250 determines a transmitter specific compensation $C_i$ based on the position i of the transmitter 220 within the transmitter array 221.

Prior to determining the compensation $C_i$ for each transmitter 220 within the transmitter array 221, the controller 250 executes a calibration routine. The calibration routine includes determining a calibration constant of each transmitter 220 by calculating:

$$K_i = \frac{C_{ci}}{\Delta T_G * i} \quad (1)$$

where $K_i$ is a calibration constant of a transmitter 220 having position i (a<i<n, where a=1) in the transmitter array 221, $\Delta T_G$ is the temperature difference between the first received temperature measurement $T_{S1}$ of the first temperature sensor 240a and the second received temperature measurement $T_{S2}$ of the second temperature sensor 240b:

$$\Delta T_G = T_{S1} - T_{S2} \quad (2)$$

and $C_{ci}$ is a tuning compensation to tune the transmitter 220 to output a signal at its associated wavelength. The calibration routine also includes determining an average calibration constant K of the transmitters 220 by calculating:

$$K = \frac{\sum_{i=1}^{n} K_i}{n} \quad (3)$$

where n is the number of transmitters 220 within the transmitter array 221. Alternatively, equation (1) can be linearized using a least-mean-square method (or any other appropriate mathematical method). An exemplary equation includes:

$$C_C(i) = K^* \Delta T_G^* i + C_0 \quad (4)$$

where $C_C$ is a function of a position i of the transmitter 220 within the transmitter array 221 and $C_0$ is an offset constant (e.g., an offset of a line having a slope of K adhering to equation 4).

Once the controller 250 executes the calibration routine, the controller 250 can then determine the compensation $C_i$ during the normal operation of the transmitter system 200, i.e., when the transmitters 220 are transmitting a signal at their calibrated wavelength λ. Once again, the controller 250 receives a temperature measurement from the temperature sensors 240, then the controller 20 determines a temperature difference $\Delta T_G$ between a first temperature measurement $T_{S1}$ of the first temperature sensor 240a and a second temperature measurement $T_{S2}$ of the second temperature sensor 240b (See EQ. 2)

Then the controller 250 determines the compensation $C_i$ of each transmitter by calculating:

$$C_i = K^* \Delta T_G^* + C_0 \quad (5)$$

where K is the average calibration constant of the transmitters found from equation (3) or equation (4), and i is an integer having a value between one and n, n being the number of transmitters 220 of the transmitter array 221.

Once the controller 250 determines the compensation $C_i$ of each transmitter 220 within the transmitter array 221, the controller optionally executes the compensation $C_i$. The compensation $C_i$ is an adjustment of a state (i.e., temperature, current, or other properties) of the transmitter 220. The compensation $C_i$ may optionally be a temperature adjustment of the transmitter 220. For example, the controller 250 may alter a temperature of each transmitter 220 by controlling the heater 224 of the transmitter 220. As previously discussed, the heater 224 of the transmitter 220 is one way of altering the temperature of the transmitter 220. The transmitter sensor 222 may send the controller 250 a transmitter temperature providing the controller 250 with feedback as the controller 250 is controlling the heater 224 to alter the temperature of the transmitter 220.

In some implementations, the compensation $C_i$ includes a bias current for the heater 224 of the transmitter 220. In such a case, the controller 250 delivers a bias current to the heater 224 of each transmitter 220 that corresponds to the compensation for the transmitter 220. The controller 250 may also receive a transmitter temperature from the transmitter sensor 222 to monitor the temperature of the transmitter 220 while controlling its temperature.

In some implementations, the compensation $C_i$ includes a bias current for the tuning element 226 of the transmitter 220. In such instance, the controller 250 delivers a bias current to the tuning element 226 of each transmitter 220 that corresponds to the compensation for the transmitter 220. Other examples of adjusting the state of the transmitter are possible as well (e.g., adjustment to the physical properties of the transmitter 220).

Figure 4:
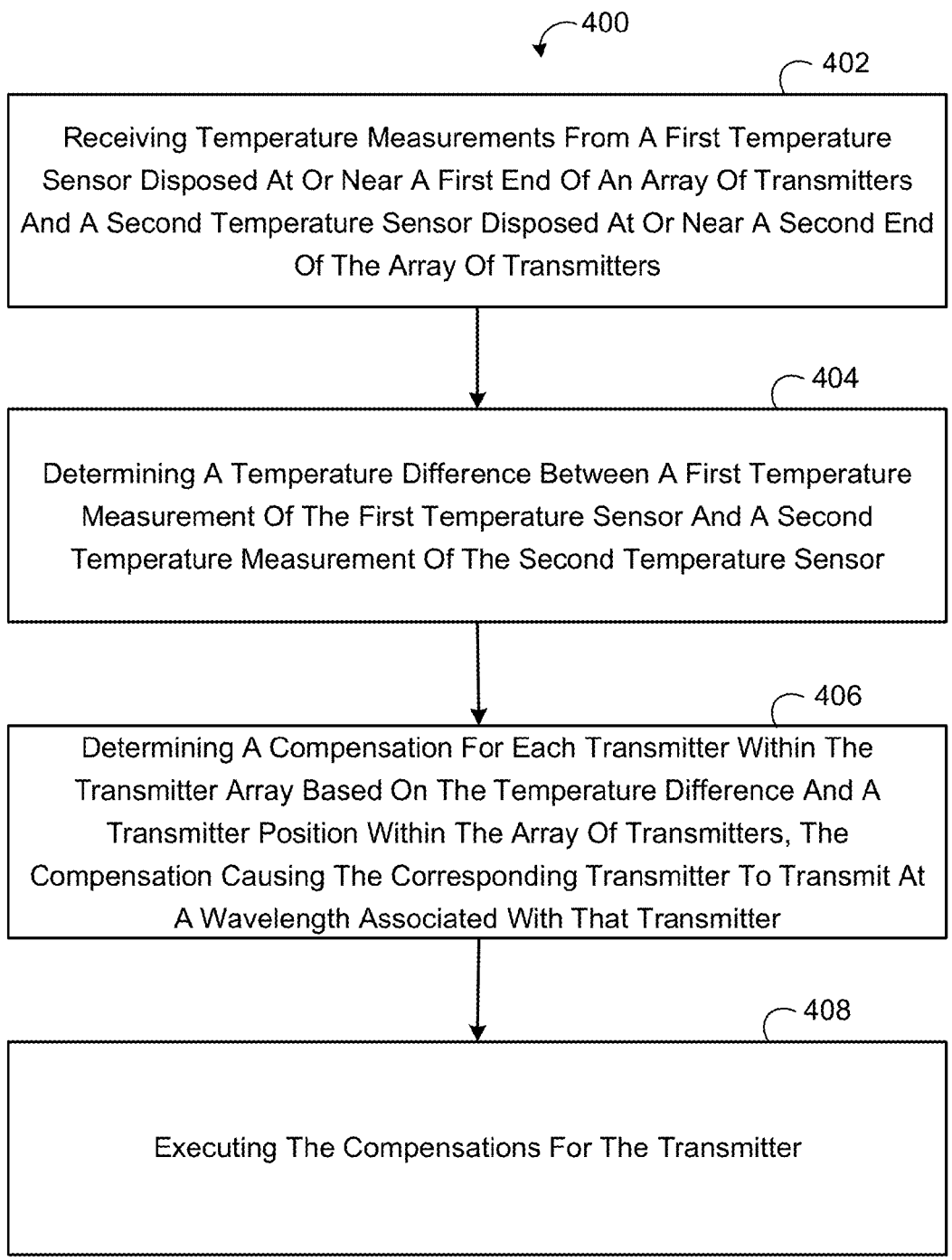
FIG. 4 is a schematic view of an exemplary arrangement of operations for compensating the temperature of individual lasers within a transmitter device.

Referring to FIG. 4, in some implementations, a method 400 for compensating a temperature $T_i$ of individual transmitters 220 (e.g., optical lasers) within a transmitter system 200 includes: receiving 402, at a data processing hardware (e.g., controller 250), temperature measurements from a first temperature sensor 240a disposed at or near a first end of an array 221 of transmitters 220 and a second temperature sensor 240b disposed at or near a second end of the array 221 of transmitters 220; and determining 404, using the data processing hardware 250, a temperature difference $\Delta T_G$ between a first temperature measurement of the first temperature sensor 240a and a second temperature measurement of the second temperature sensor 240b. The method 400 also includes: determining 406, using the data processing hardware 250, a compensation $C_i$ for each transmitter 220 within the transmitter array 221 based on the temperature difference ($\Delta T_G$) and a transmitter position within the array 221 of transmitters 220, the compensation $C_i$ causing the corresponding transmitter 220 to transmit at a wavelength λ associated with that transmitter 220; and executing 408, using the data processing hardware 250, the compensations $C_i$ for the transmitters 220.

In some implementations, the method 400 includes altering a temperature of each transmitter 220 by its corresponding temperature adjustment, when the compensation $C_i$ includes a temperature adjustment. The method 400 may also include controlling a heater 224 of a transmitter 220 to alter the temperature $T_i$ of the transmitter 220. In some examples, the method 400 includes receiving a transmitter temperature measurement $T_i$ from a temperature sensor 222 of each transmitter 220 (e.g., as feedback to maintain the desired temperature of the transmitter 220). In some examples, the method 400 also includes determining a temperature difference $\Delta T_i$ between each transmitter 220 and a reference temperature (e.g., a reference temperature may optionally be a temperature $T_{S3}$ of the heat pump 230 measure by the third temperature sensor 240c.

In some implementations, when the compensation $C_i$ includes a bias current $I_H$ for a heater 224 of a transmitter 220 (e.g., DBR laser), the method 400 includes delivering a bias current $I_H$ to the heater 224 of each transmitter 220 that corresponds to the compensation $C_i$ for the transmitter 220. When the compensation comprises a bias current $I_T$ for a tuning element 226 of a transmitter 220, the method 400 may include delivering a bias current $I_T$ to the tuning element 226 of each transmitter 220 that corresponds to the compensation for the transmitter 220. In some examples, the array 221 of transmitters 220 includes multiple distributed Bragg reflector (DBR) lasers 300, where each laser 300 outputs a signal at a different wavelength λ.

The method 400 may include receiving the third temperature measurement $T_{S3}$ from the third temperature sensor 240c disposed on a heat pump 230 (e.g., a thermo-electric cooler). The array 221 of transmitters 220 is disposed on the heat pump 230. The method 400 also includes maintaining a temperature of the heat pump 230 using the third temperature measurement $T_{S3}$.

In some examples, the method 400 also includes flowing air over the transmitter device 202 with or without a heat sink 230. In some examples, the method 400 includes flowing air along a direction going from the first end 221a of the transmitter array 221 to the second end 221b of the transmitter array 221 or from the second end 221b of the transmitter array 221 to the first end 221a of the transmitter array 221.

A number of implementations have been described. Nevertheless, it will be understood that various modifications may be made without departing from the spirit and scope of the disclosure. Accordingly, other implementations are within the scope of the following claims.

What is claimed is:

1. A device comprising:
   an array of optical transmitters having a first end and a second end;
   a first temperature sensor disposed at or near the first end of the array of transmitters;
   a second temperature sensor disposed at or near the second end of the array of transmitters;
   a controller in communication with the temperature sensors, and the transmitters, the controller:
      receiving temperature measurements from the temperature sensors;
      determining a temperature difference between a first temperature measurement of the first temperature sensor and a second temperature measurement of the second temperature sensor;
      determining a compensation for each transmitter within the transmitter array based on the temperature difference and a transmitter position within the array of transmitters, the compensation causing the corresponding transmitter to transmit at a wavelength associated with that transmitter; and
      executing the compensations for the transmitters.

2. The device of claim 1, wherein the compensation comprises a temperature adjustment, the controller altering a temperature of each transmitter by its corresponding temperature adjustment.

3. The device of claim 2, wherein the controller controls a heater of a transmitter to alter the temperature of the transmitter.

4. The device of claim 3, wherein the controller receives a transmitter temperature measurement from a temperature sensor of each transmitter.

5. The device of claim 4, wherein the controller determines a temperature difference between each transmitter and a reference temperature.

6. The device of claim 1, wherein the compensation comprises a bias current for a heater of a transmitter, the controller delivering a bias current to the heater of each transmitter that corresponds to the compensation for the transmitter.

7. The device of claim 1, wherein the compensation comprises a bias current for a tuning element of a transmitter, the controller delivering a bias current to the tuning element of each transmitter that corresponds to the compensation for the transmitter.

8. The device of claim 1, wherein the array of transmitters comprises multiple distributed feedback lasers, each laser outputting a signal at a different wavelength.

9. The device of claim 1, further comprising:
   a heat pump, the array of transmitters disposed on the heat pump; and
   a third temperature sensor disposed on the heat pump and in communication with the controller, the controller receiving a third temperature measurement of the heat pump as feedback from the third temperature sensor to maintain a temperature of the heat pump.

10. The device of claim 1, wherein the compensation comprises a temperature adjustment, the controller altering a temperature of each transmitter by its corresponding temperature adjustment while assuming a linear temperature gradient between the first and second temperature sensors.

11. The device of claim 1, wherein the controller determines the compensation $C_i$ of each transmitter by calculating:

$$C_i = K * \Delta T_G * i + C_0$$

wherein K is an average calibration constant of the transmitters, $\Delta T_G$ is the temperature difference between the first temperature measurement of the first temperature sensor and the second temperature measurement of the second temperature sensor, i is an integer having a value between one and n, n being the number of transmitters of the transmitter array, and $C_0$ is an offset constant.

12. The device of claim 11, wherein the controller executes a calibration routine, the calibration routine comprising:
   determining a calibration constant of each transmitter by calculating:

$$K_i = \frac{C_{ci}}{\Delta T_G * i}$$

wherein $K_i$ is a calibration constant of a transmitter having position i in the transmitter array, $\Delta T_G$ is the temperature difference between the first and second received temperature measurements of the first and second temperature sensors; and $C_{ci}$ is a compensation to tune the transmitter to output a signal at its associated wavelength; and
determining an average calibration constant K of the transmitters by calculating:

$$K = \frac{\sum_{i=1}^{n} K_i}{n}.$$

13. The device of claim 1, further comprising:
   a transmitter optical sub-assembly package having first and second ends, the first end of the transmitter optical sub-assembly package disposed adjacent the first end of the array of transmitters and the second end of the transmitter optical sub-assembly package disposed adjacent the second end of the array of transmitters;
   wherein the first and second temperature sensors are disposed on or near the corresponding first and second ends of the transmitter optical sub-assembly package.

14. The device of claim 13, further comprising an air mover arranged to flow air over the transmitter optical sub-assembly package.

15. The device of claim 14, wherein the air mover flows air along a direction going from the first end of the transmitter array to the second end of the transmitter array or from the second end of the transmitter array to the first end of the transmitter array.

16. A method comprising:
   receiving, at data processing hardware, temperature measurements from a first temperature sensor disposed at or near a first end of an array of transmitters and a second temperature sensor disposed at or near a second end of the array of transmitters;
   determining, by the data processing hardware, a temperature difference between a first temperature measurement of the first temperature sensor and a second temperature measurement of the second temperature sensor;
   determining, by the data processing hardware, a compensation for each transmitter within the transmitter array based on the temperature difference and a transmitter position within the array of transmitters, the compensation causing the corresponding transmitter to transmit at a wavelength associated with that transmitter; and
   executing, by the data processing hardware, the compensations for the transmitters.

17. The method of claim 16, further comprising, when the compensation comprises a temperature adjustment, altering a temperature of each transmitter by its corresponding temperature adjustment.

18. The method of claim 17, further comprising controlling a heater of a transmitter to alter the temperature of the transmitter.

19. The method of claim 18, further comprising receiving a transmitter temperature measurement from a temperature sensor of each transmitter.

20. The method of claim 19, further comprising determining a temperature difference between each transmitter and a reference temperature.

21. The method of claim 16, further comprising, when the compensation comprises a bias current for a heater of a transmitter, delivering a bias current to the heater of each transmitter that corresponds to the compensation for the transmitter.

22. The method of claim 16, further comprising, when the compensation comprises a bias current for a tuning element of a transmitter, delivering a bias current to the tuning element of each transmitter that corresponds to the compensation for the transmitter.

23. The method of claim 16, wherein the array of transmitters comprises multiple distributed feedback lasers, each laser outputting a signal at a different wavelength.

24. The method of claim 16, further comprising:
receiving a third temperature measurement from a third temperature sensor disposed on a heat pump, the array of transmitters disposed on the heat pump; and
maintaining a temperature of the heat pump using the third temperature measurement.

25. The method of claim 16, further comprising, when the compensation comprises a temperature adjustment, altering a temperature of each transmitter by its corresponding temperature adjustment while assuming a linear temperature gradient between the first and second temperature sensors.

26. The method of claim 16, further comprising determining the compensation $C_i$ of each transmitter by calculating:

$$C_i = K * \Delta T_G i + C_0$$

wherein K is an average calibration constant of the transmitters, $\Delta T_G$ is the temperature difference between the first temperature measurement of the first temperature sensor and the second temperature measurement of the second temperature sensor, i is an integer having a value between one and n, n being the number of transmitters of the transmitter array, and $C_0$ is an offset constant.

27. The method of claim 26, further comprising executing a calibration routine, the calibration routine comprising:
determining a calibration constant of each transmitter by calculating:

$$K_i = \frac{C_{ci}}{\Delta T_G * i}$$

wherein $K_i$ is a calibration constant of a transmitter having position i in the transmitter array, $\Delta T_G$ is the temperature difference between the first and second received temperature measurements of the first and second temperature sensors; and $C_{ci}$ is a compensation to tune the transmitter to output a signal at its associated wavelength; and
determining an average calibration constant K of the transmitters by calculating:

$$K = \frac{\sum_{i=1}^{n} K_i}{n}.$$

28. The method of claim 16, wherein the first and second temperature sensors are disposed on or near corresponding first and second ends of a transmitter optical sub-assembly package having first and second ends, the first end of the transmitter optical sub-assembly package disposed adjacent the first end of the array of transmitters and the second end of the transmitter optical sub-assembly package disposed adjacent the second end of the array of transmitters.

29. The method of claim 28, further comprising flowing air over the transmitter optical sub-assembly package.

30. The method of claim 29, further comprising flowing air along a direction going from the first end of the transmitter array to the second end of the transmitter array or from the second end of the transmitter array to the first end of the transmitter array.

* * * * *